(12) United States Patent
Moon et al.

(10) Patent No.: US 8,826,096 B2
(45) Date of Patent: Sep. 2, 2014

(54) METHOD OF DECODING LDPC CODE FOR PRODUCING SEVERAL DIFFERENT DECODERS USING PARITY-CHECK MATRIX OF LDPC CODE AND LDPC CODE SYSTEM INCLUDING THE SAME

(75) Inventors: Jaekyun Moon, Daejeon (KR);
Soonyoung Kang, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 128 days.

(21) Appl. No.: 13/473,800

(22) Filed: May 17, 2012

(65) Prior Publication Data
US 2013/0173982 A1 Jul. 4, 2013

(30) Foreign Application Priority Data

Dec. 29, 2011 (KR) .................. 10-2011-0145651
Apr. 19, 2012 (KR) .................. 10-2012-0041105

(51) Int. Cl.
*H03M 13/00* (2006.01)
*H03M 13/03* (2006.01)
*H04B 3/46* (2006.01)
*H04L 5/12* (2006.01)
*H04L 27/06* (2006.01)
*H03M 13/11* (2006.01)
*H03M 13/37* (2006.01)
*H03M 13/29* (2006.01)
*H04L 1/00* (2006.01)

(52) U.S. Cl.
CPC ...... *H03M 13/1111* (2013.01); *H03M 13/1102* (2013.01); *H03M 13/1162* (2013.01); *H03M 13/616* (2013.01); *H03M 13/3715* (2013.01); *H03M 13/3753* (2013.01); *H03M 13/3761* (2013.01); *H03M 13/29* (2013.01); *H03M 13/2957* (2013.01); *H03M 13/2963* (2013.01); *H04L 1/0009* (2013.01); *H04L 1/0061* (2013.01); *H04L 1/0065* (2013.01)
USPC ........... 714/758; 714/752; 714/755; 714/780; 714/785; 714/786; 714/799; 714/800; 714/801; 714/821; 375/224; 375/262; 375/341

(58) Field of Classification Search
CPC .................... H03M 13/1111; H03M 13/1102; H03M 13/1162; H03M 13/616; H03M 13/3715; H03M 13/3753; H03M 13/3761; H03M 13/29; H03M 13/2957; H03M 13/2963; H04L 1/0009; H04L 1/0061; H04L 1/0065
USPC ......... 714/752, 755, 758, 780, 785, 786, 799, 714/800, 801, 821; 375/224, 262, 341
See application file for complete search history.

(56) References Cited

U.S. PATENT DOCUMENTS

| | | | |
|---|---|---|---|
| 7,389,464 B2 * | 6/2008 | Jeong et al. ................ | 714/752 |
| 7,414,551 B2 * | 8/2008 | Lee et al. .................. | 341/107 |
| 7,516,389 B2 * | 4/2009 | Song ........................ | 714/755 |
| 7,519,895 B2 * | 4/2009 | Kyung et al. .............. | 714/780 |
| 7,934,147 B2 * | 4/2011 | Lakkis ...................... | 714/800 |
| 8,196,025 B2 * | 6/2012 | Lakkis ...................... | 714/800 |
| 8,291,285 B1 * | 10/2012 | Varnica et al. ............. | 714/752 |
| 8,335,977 B2 * | 12/2012 | Weingarten et al. ........ | 714/794 |
| 8,537,919 B2 * | 9/2013 | Fonseka et al. ............ | 375/265 |
| 8,543,881 B2 * | 9/2013 | Kang et al. ................ | 714/752 |
| 2005/0111592 A1 * | 5/2005 | Yee .......................... | 375/341 |
| 2005/0149841 A1 * | 7/2005 | Kyung et al. .............. | 714/800 |
| 2005/0160351 A1 * | 7/2005 | Ko et al. ................... | 714/801 |
| 2005/0283707 A1 * | 12/2005 | Sharon et al. .............. | 714/758 |
| 2008/0294959 A1 * | 11/2008 | Chindapol et al. ......... | 714/752 |
| 2009/0177943 A1 * | 7/2009 | Silvus et al. ............... | 714/755 |
| 2009/0276689 A1 * | 11/2009 | Tan et al. ................... | 714/799 |
| 2009/0327832 A1 * | 12/2009 | Ichihara .................... | 714/752 |
| 2012/0233521 A1 * | 9/2012 | Kwok et al. ............... | 714/758 |
| 2013/0058431 A1 * | 3/2013 | Fonseka et al. ............ | 375/295 |
| 2013/0132804 A1 * | 5/2013 | Frayer et al. .............. | 714/780 |
| 2013/0145229 A1 * | 6/2013 | Frayer et al. .............. | 714/755 |
| 2013/0145231 A1 * | 6/2013 | Frayer et al. .............. | 714/763 |
| 2013/0246879 A1 * | 9/2013 | Chaichanavong et al. ... | 714/752 |

FOREIGN PATENT DOCUMENTS

| EP | 2124344 A1 * | 11/2009 | ............ H03M 13/29 |
|---|---|---|---|
| KR | 10-2008-0088030 A | 10/2008 | |
| KR | 10-2011-0000013 A | 1/2011 | |

* cited by examiner

*Primary Examiner* — John J Tabone, Jr.
(74) *Attorney, Agent, or Firm* — The PL Law Group, PLLC

(57) ABSTRACT

Provided are a method of decoding an LDPC code for producing several different decoders using a parity-check matrix of the LDPC code, and an LDPC code system including the same. The system includes: an LDPC encoder outputting an LDPC codeword through a channel; a first LDPC decoder decoding the LDPC codeword received through the channel, and when the decoding has failed in a second LDPC decoder, decoding the LDPC codeword according to original parity check matrix of the LDPC codeword, using soft information newly generated after the decoding is ended in the second LDPC decoder; and the second LDPC decoder, when the decoding has failed in the first LDPC decoder, receiving the soft information on each bit from the first LDPC, and decoding the LDPC codeword according to a new parity-check matrix produced from the parity-check matrix of the LDPC codeword using the received soft information on each bit.

15 Claims, 3 Drawing Sheets

Parity check matrix     New parity check matrix

METHOD OF DECODING LDPC CODE FOR PRODUCING SEVERAL DIFFERENT DECODERS USING PARITY-CHECK MATRIX OF LDPC CODE AND LDPC CODE SYSTEM INCLUDING THE SAME

CROSS-REFERENCE TO RELATED APPLICATIONS AND CLAIM OF PRIORITY

This application claims priority from and the benefit of Korean Patent Application No. 10-2011-0145651, filed on Dec. 29, 2011, and Korean Patent Application No. 10-2012-0041105, filed on Apr. 19, 2012, the disclosures of which are incorporated herein by reference.

BACKGROUND

1. Technical Field

The present disclosure relates to a method of decoding a low-density parity-check (LDPC) code and an LDPC code system using the same.

2. Description of Related Art

An LDPC code is a linear block code and includes k-bit information and p-bit parity. That is, the total length n is the sum of k and p. A code rate representing the ratio of an information bit in length to the total length may be represented by the expression k/n. During encoding of the LDPC code, using a parity-check matrix, an input of k is received and an output of n is output.

A decoding algorithm of the LDPC code is based on a message passing algorithm. The message passing algorithm mainly includes two processes. First, bit-to-check message passing is performed. During bit-to-check message passing, bit nodes bound to the same check node transceive messages with each other in order to provide information on other bit nodes in the same group. Here, the bit-to-check bound structure is fixed so that the sum of bit determination values bound to the common check according to the parity-check matrix becomes an even number (to satisfy an even parity condition). After the bit-to-check message passing process, check-to-bit message passing is performed. During the check-to-bit message passing, check nodes bound to a single bit node perform an operation of transceiving messages with each other. The bit-to-check message passing and the check-to-bit message passing are iteratively performed until the LDPC code is decoded into a valid codeword or until the maximum iteration count has reached. When the LDPC code is used in connection to other codes, error correction ability is enhanced. However, parity bits are increased due to an additional encoding process, there is a problem in that code rate is reduced. In addition, an additional encoding process, and an increase in complexity due to a corresponding additional decoding process may not be avoided.

A basic LDPC code system according to related art may include, as illustrated in FIG. 1, an LDPC encoder that encodes an LDPC code which is input data so as transmitted to a channel, and an LDPC decoder that receives and decodes the LDPC code received through the channel.

A decoding process of the LDPC decoder is iteratively performed until a determined value (x_hat) becomes a valid codeword, or until the maximum iteration count has reached.

However, the LDPC code system having the above configuration according to the related art has problems in that, as described above, since the LDPC code is used in connection to other codes for the error correction ability, parity bits are increased due to an additional encoding process and thus code rate is reduced. In addition, there are problems of an additional encoding process and an increase in complexity due to a corresponding additional decoding process.

SUMMARY

According to an aspect of the present invention, the present disclosure is directed to providing a method of decoding an LDPC code and a LDPC code system including the same, capable of producing several different decoders using a single LDPC parity-check matrix.

According to an aspect of the present invention, the present disclosure is also directed to providing a method of decoding an LDPC code and a LDPC code system including the same, in which an additional encoding process is not needed, an existing code is used as it is, and thus code rate is not changed.

According to an aspect of the present invention, the present disclosure is also directed to providing a method of decoding an LDPC code and a LDPC code system including the same, in which a second LDPC decoder is operated only when a first LDPC decoder has failed in error correction, and thus speed loss due to an additional operation may be minimized.

The technical problems of the disclosure are not limited to those mentioned above, and other problems that are not mentioned may be clearly understood by those skilled in the art from the description below.

In one general aspect, the present disclosure provides a method of decoding an LDPC code including: (a) outputting an LDPC codeword from an LDPC encoder through a channel; (b) decoding the LDPC codeword output through the channel by a first LDPC decoder; (c) when the decoding has failed in the first LDPC decoder, receiving soft information on each bit from the first LDPC and decoding the LDPC codeword according to a new parity-check matrix produced from a parity-check matrix of the LDPC codeword, by a second LDPC decoder; (d) when the decoding has failed in the second LDPC decoder, receiving soft information newly generated after the decoding is ended from the second LDPC decoder and decoding the LDPC codeword according to the parity-check matrix of the LDPC codeword, by the first LDPC decoder; and (e) iteratively performing (c) and (d) until the LDPC code is decoded or until a maximum iteration count.

In another general aspect, the present disclosure provides an LDPC code system including: an LDPC encoder outputting an LDPC codeword through a channel; a first LDPC decoder decoding the LDPC codeword received through the channel, and when the decoding has failed in a second LDPC decoder, decoding the LDPC codeword according to a parity-check matrix of the LDPC codeword, using soft information newly generated after the decoding is ended in the second LDPC decoder; and the second LDPC decoder, when the decoding has failed in the first LDPC decoder, receiving the soft information on each bit from the first LDPC, and decoding the LDPC codeword according to a new parity-check matrix produced from the parity-check matrix of the LDPC codeword using the received soft information on each bit.

Here, the new parity-check matrix may have new rows produced by linear operations on rows in the parity-check matrix of the LDPC codeword.

In addition, the new parity-check matrix may have new columns produced by linear operations on columns in the parity-check matrix of the LDPC codeword.

In addition, the new parity-check matrix may have new rows and columns produced by linear operations on rows and columns in the parity-check matrix of the LDPC codeword.

When the even or odd number of rows or columns are combined through the binary addition, bit nodes bound to two check nodes may be bound to a combined check node, and an overlapping bit node may be broken. In addition, the soft information may be probability information of "1" or "0" on each bit.

DETAILED DESCRIPTION OF EXEMPLARY EMBODIMENTS

Figure 1:
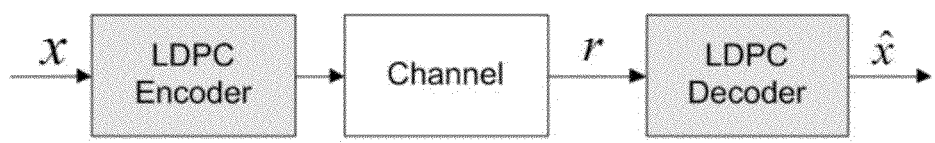
FIG. 1 is a block diagram of a basic LDPC code system according to related art.

Exemplary embodiments now will be described more fully hereinafter with reference to the accompanying drawings, in which exemplary embodiments are shown. The present disclosure may, however, be embodied in many different forms and should not be construed as limited to the exemplary embodiments set forth therein. In addition, in the drawings, parts that are not related to the description may be omitted to clearly describe the disclosure, and like elements are denoted by like reference numerals through the specification.

Hereinafter, specific technical contents of the disclosure are described in detail with reference to the accompanying drawings.

Figure 2:
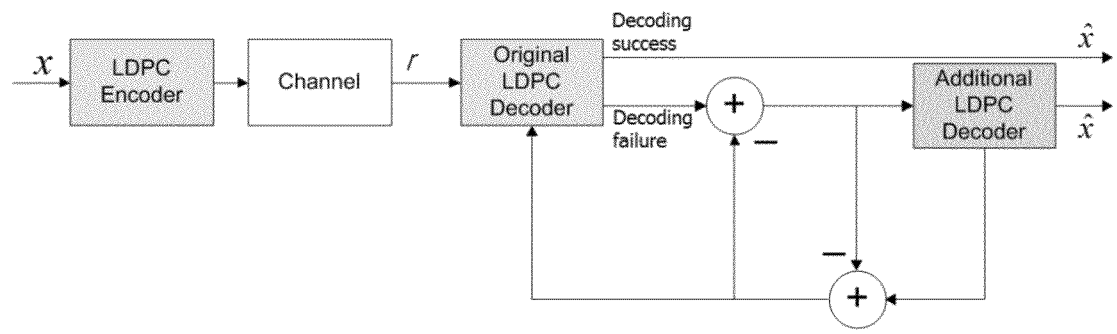
FIG. 2 is a block diagram of an LDPC code system according to an exemplary embodiment of the disclosure.

FIG. 2 is a block diagram of an LDPC code system according to an exemplary embodiment of the disclosure.

The LDPC code system of the disclosure includes, as illustrated in FIG. 2, an LDPC encoder 110, a channel 120, a first LDPC decoder 130, and a second LDPC decoder 140.

The LDPC encoder 110 encodes an LDPC code which is input data so as to be transmitted to the channel 120.

In the LDPC encoder 110, in order to transmit the data to be transmitted to the channel 120 without loss and deterioration, an LDPC coding procedure is performed. The data subjected to the channel coding procedure may be transmitted as a single symbol by collecting several bits when the data is transmitted to the wireless channel 120. Here, a procedure of mapping several bits into a symbol is referred to as modulation.

The modulated data is converted into a signal for multiple transfers through a multiplexing process or a multiple access method. As the multiplexing method, there are various methods including CDM, TDM, and FMD. The signal passing through the multiplexing block is changed to a structure appropriate for being transmitted to one or more multiple antennas and is transmitted to a receiver through the wireless channel. The data transmitted in this process undergoes fading, column noise, and the like, so that deterioration of data may occur. The receiving end receives the deteriorated data and then performs a series of procedures of the transmitting end in the reverse order. A modulation operation of changing the data mapped into the symbol to a bit string is performed, and the data deteriorated through the channel decoding procedure is restored to the original data.

The LDPC encoder 110 that performs the channel coding stores an H matrix which is a parity-check matrix used for generating parity bits to be added to the input data (information bits or systematic bits), or a generation matrix G derived from the H matrix. That is, the LDPC encoder generates parity bits from the H or G matrix and the input data.

The first and second LDPC decoders 130 and 140 are devices for performing channel decoding, confirm whether or not the data (systematic bits) input through the operation of the received data (deteriorated systematic bits+parity bits) and the H matrix is reliably restored, and perform the operation again when the recovery has failed.

Specifically, the first LDPC decoder 130 decodes an LDPC codeword received through the channel 120. Here, in the first LDPC decoder 130, when decoding has failed, the second LDPC decoder 140 receives soft information on each bit from the first LDPC 130, and decodes an LDPC codeword according to a new parity-check matrix generated from the parity-check matrix of the LDPC codeword using the received soft information on each bit. Here, the soft information represents probability information of "1" or "0" on each bit. That is, according to the disclosure, the same auxiliary LDPC decoder as the second LDPC decoder that performs decoding according to a new parity-check matrix produced from the parity-check matrix of the first LDPC decoder is used. The auxiliary LDPC decoder may be changed in number. In addition, the first LDPC decoder and the auxiliary LDPC decoders may constitute a serial concatenation, a parallel concatenation, or a combination of serial and parallel concatenations.

If decoding has failed even in the second LDPC decoder 140, the first LDPC decoder 130 decodes the LDPC codeword according to the new parity-check matrix generated from the parity-check matrix of the LDPC codeword, using soft information newly generated after the decoding operation of the second LDPC decoder 140 is ended.

In this manner, in the embodiment of the disclosure, until the LDPC code is decoded or until the maximum iteration count, the LDPC codeword is decoded through a feedback process in which extrinsic information is transceived between the first and second LDPC decoders 130 and 140.

Here, the new parity-check matrix may have new rows or columns generated by linear operations on rows or columns in the parity-check matrix of the LDPC codeword, or have new rows and columns generated by linear operations on rows and columns in the parity-check matrix of the LDPC codeword. The new parity-check matrix will be described in detail with reference to FIGS. 3 and 4 described later.

The second LDPC decoder 140 is produced on the basis of the parity-check matrix newly generated by the method proposed by the disclosure. The LDPC code system of the disclosure has an advantage that, since an additional encoding process is absent, complexity of the transmission side is maintained and code rate is not changed. In addition, during decoding by the reception side, the second LDPC decoder 140 is designed to operate only when the first LDPC decoder 130 has failed in decoding, so that speed loss due to the additional operation may be minimized. That is, when the first LDPC decoder 130 has failed in decoding on the reception side, the second LDPC decoder 140 receives the soft information on each bit from the first LDPC decoder 130 so as to operate. Here, after the operation of the second LDPC decoder 140 is ended, the newly generated soft information is transmitted to the first LDPC decoder 130. That is, the first and second decoders 130 and 140 undergo the feedback process in which extrinsic information is transceived.

Next, a method of designing the second LDPC decoder 140 will be described. Since the decoder structure of the LDPC code is based on the parity-check matrix, in order to design an additional decoder, an additional parity-check matrix is needed. An additional parity-check matrix proposed by the disclosure is to produce a new row or column, or row and column from a combination of an even or odd number of rows or columns, or rows and columns of a basic parity-check matrix.

Figure 3:
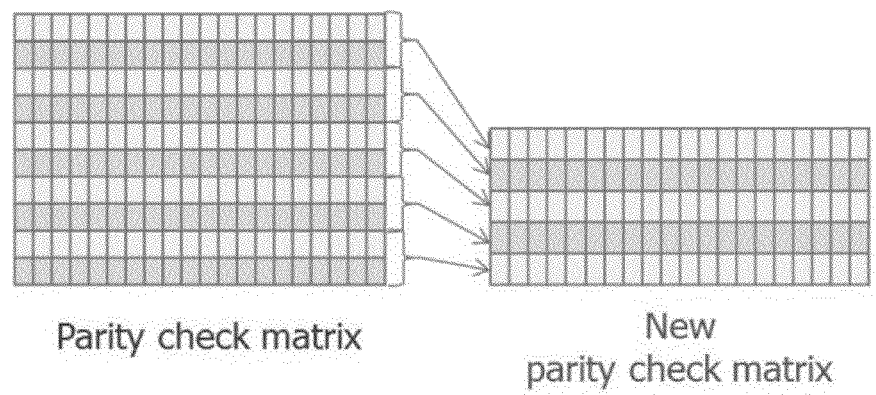
FIG. 3 is a diagram illustrating an example of generating a row of a new parity-check matrix by combining two rows of a parity-check matrix through binary addition.

FIG. 3 is a diagram illustrating an example of generating a row of a new parity-check matrix by combining two rows of a parity-check matrix through binary addition.

As in FIG. 3, a new parity-check matrix is produced by adding two rows through binary addition. Since a change in check node degree (the number of bit nodes bound to a single check node) due to two binary additions is even number as it is, an even number parity condition is satisfied as it is. That is, an existing code may be decoded using the newly produced parity-check matrix. Here, decoding can be made using a newly produced matrix as long as the condition in which the number of combined rows is an even number is satisfied, so that the number of rows does not have to be 2 (a number of combinations can be made).

In this manner, a new parity-check matrix may be produced by adding an even or odd number of columns through binary addition, or a new parity-check matrix may be produced by adding an even or odd number of rows and columns through binary addition.

Figure 4:
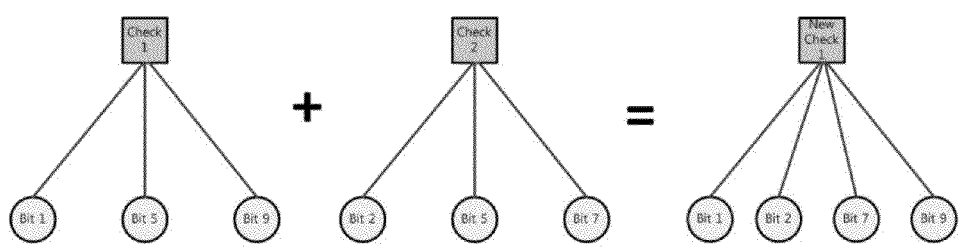
FIG. 4 is a diagram illustrating an example of combining two check nodes into a single check node.

Meanwhile, an arbitrary parity-check matrix may be represented as a bipartite graph configured of check nodes and variable nodes. FIG. 4 illustrates an example of combining two check nodes into a single check node using a bipartite graph.

In FIG. 4, combining two rows means combining two check nodes in the bipartite graph. Here, bit nodes bound to the two check nodes are bound to the combined check node, and an overlapping bit node is broken (characteristics of the boundary addition).

Figure 5:
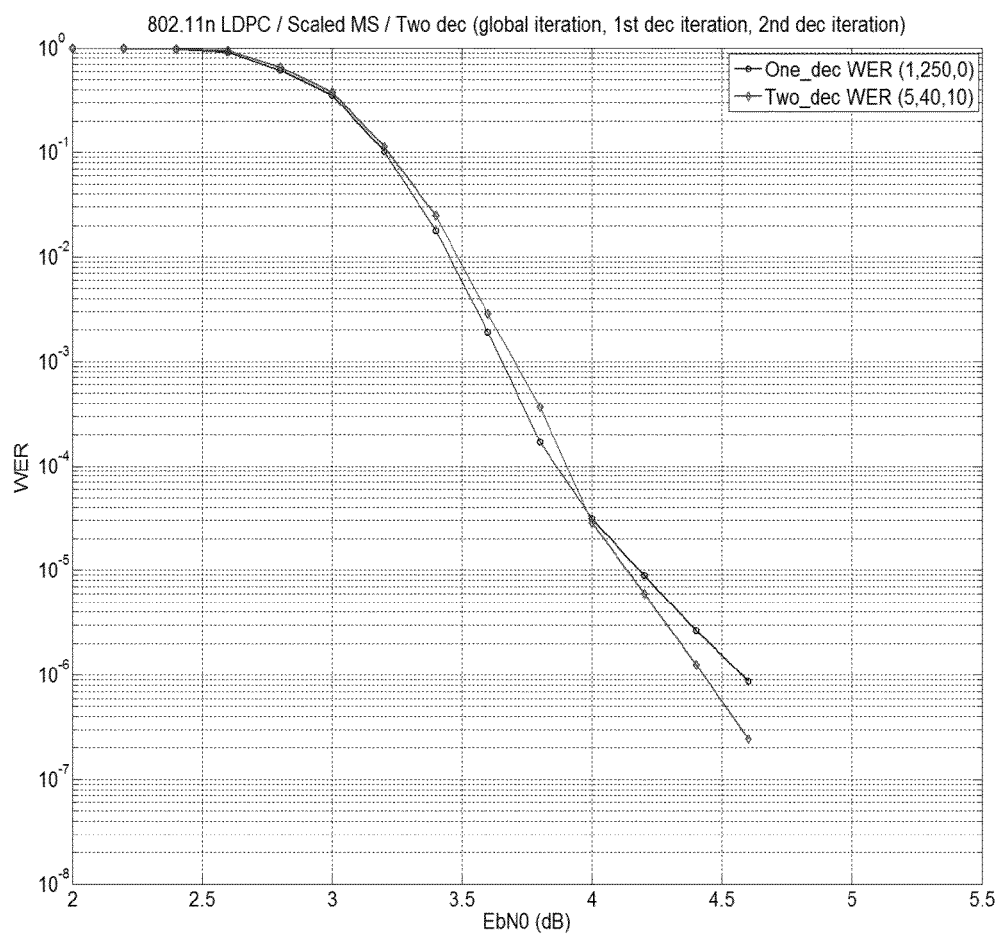
FIG. 5 is a graph showing the results of a simulation of error correction abilities according to signal-to-noise ratio (SNR) of the LDPC code system according to the related art and the LDPC code system proposed by the disclosure.

FIG. 5 shows the results of a simulation of error correction abilities according to signal-to-noise ratio (SNR) of the general LDPC code system (normal) and the LDPC code system proposed by the disclosure. The same AWGN data was generated at each SNR. Here, $I_{D1}$ and $I_{D2}$ respectively represent the maximum iteration counts of the first LDPC decoder 130 and the second LDPC decoder 140. $I_G$ represents feedback counts of the two decoders. That is, the general LDPC code system (normal) in FIG. 5 is a system in which only the first LDPC decoder 130 is operated and the maximum iteration count is fixed to 250. On the other hand, in the LDPC code system proposed by the disclosure, the first and the second LDPC decoders 130 and 140 have maximum iteration counts of 40 and 10, respectively, and have a maximum feedback count of 5. Consequently, the two systems are both fixed to the 250 maximum iteration counts. According to the simulation results, it can be seen that the proposed system shows better error correction ability than the existing system in high SNR areas.

According to one or more embodiments, several different decoders may be produced using a single LDPC parity-check matrix.

According to one or more embodiments, additional encoding process is not needed, an existing code is used as it is, and thus code rate is not changed.

According to one or more embodiments, the second LDPC decoder may be operated only when the first LDPC decoder has failed in error correction, and thus speed loss due to an additional operation may be minimized.

According to one or more embodiments, as a result of implementing the LDPC code system according to the disclosure, it could be seen that error correction ability stronger than that of the LDPC code system according to the related art is shown in a high SNR region.

The advantageous effects of the disclosure are not limited to those mentioned above, and other effects that are not mentioned may be clearly understood by those skilled in the art from the description below.

The exemplary embodiments of the disclosure described above are disclosed to solve the technical problems. It should be understood by those skilled in the art that various modifications, alterations, and additions may occur without departing from the spirit and scope of the disclosure, and such modifications and alternations are within the scope of the following claims.

What is claimed is:

1. A method of decoding a low-density parity-check (LDPC) code, comprising:
   (a) outputting an LDPC codeword from an LDPC encoder through a channel;
   (b) decoding the LDPC codeword output through the channel by a first LDPC decoder according to a parity check matrix derived from a parity-check matrix of the LDPC codeword;
   (c) when the decoding has failed in the first LDPC decoder, receiving soft information on each bit from the first LDPC decoder and decoding the LDPC codeword according to a new parity-check matrix produced from the parity-check matrix of the LDPC codeword by a second LDPC decoder;
   (d) when the decoding has failed in the second LDPC decoder, receiving soft information newly generated after the decoding is ended from the second LDPC decoder and decoding the LDPC codeword according to said new parity-check matrix used by the first LDPC decoder; and
   (e) iteratively performing (c) and (d) until the LDPC code is decoded or until a maximum iteration count.

2. The method according to claim 1, wherein the number of the second LPDC decoder can be changed;
   the second LDPC decoders are decoded according to the new parity-check matrix produced from the parity-check matrix of the first LDPC decoder, and
   the first LDPC decoder and the second LDPC decoders constitute a decoding system in a serial concatenation, a parallel concatenation, or a combination of serial and parallel concatenations.

3. The method according to claim 1, wherein the new parity-check matrix has new rows produced by linear operations on rows in the parity-check matrix of the LDPC codeword.

4. The method according to claim 3, wherein, when even or odd numbers of rows or columns are linearly combined through a binary addition, bit nodes bound to two check nodes are bound to a combined check node, and an overlapping bit node is broken.

5. The method according to claim 1, wherein the new parity-check matrix has new columns produced by linear operations on columns in the parity-check matrix of the LDPC codeword.

6. The method according to claim 5, wherein, when even or odd numbers of rows or columns are linearly combined through a binary addition, bit nodes bound to two check nodes are bound to a combined check node, and an overlapping bit node is broken.

7. The method according to claim 1, wherein the new parity-check matrix has new rows and new columns produced by linear operations on rows and columns in the parity-check matrix of the LDPC codeword.

8. The method according to claim 7, wherein, when even or odd numbers of rows or columns are linearly combined through a binary addition, bit nodes bound to two check nodes are bound to a combined check node, and an overlapping bit node is broken.

9. The method according to claim 1, wherein the new parity-check matrix is derived from a different number of rows and columns from that of the parity-check matrix of the LDPC codeword.

10. The method according to claim 1, wherein the soft information is probability information of "1" or "0" on each bit.

11. A low-density parity-check (LDPC) code system, comprising:
   an LDPC encoder outputting an LDPC codeword through a channel;
   a first LDPC decoder decoding the LDPC codeword received through the channel, and when the decoding has failed in a second LDPC decoder, decoding the LDPC codeword according to a new parity-check matrix produced from the parity-check matrix of the LDPC codeword, using soft information newly generated after the decoding is ended in the second LDPC decoder; and
   the second LDPC decoder, when the decoding has failed in the first LDPC decoder, receiving the soft information on each bit from the first LDPC, and decoding the LDPC codeword according to said new parity-check matrix produced from the parity-check matrix of the LDPC codeword using the received soft information on each bit.

12. The system according to claim 11, wherein the number of the second LDPC decoder can be changed;
   the second LDPC decoders are decoded according to the new parity-check matrix produced from the parity-check matrix of the first LDPC decoder; and
   the first LDPC decoder and the second LDPC decoders constitute a decoding system in a serial concatenation, a parallel concatenation, or a combination of serial and parallel concatenations.

13. The system according to claim 11, wherein the new parity-check matrix has new rows produced by linear operations on rows in the parity-check matrix of the LDPC codeword.

14. The system according to claim 11, wherein the new parity-check matrix has new columns produced by linear operations on columns in the parity-check matrix of the LDPC codeword.

15. The system according to claim 11, wherein the new parity-check matrix has new rows and new columns produced by linear operations on rows and columns in the parity-check matrix of the LDPC codeword.

* * * * *